US008023540B2

(12) United States Patent
Kupershmidt (10) Patent No.: US 8,023,540 B2
(45) Date of Patent: Sep. 20, 2011

(54) PAIR OF OPTICALLY LOCKED SEMICONDUCTOR NARROW LINEWIDTH EXTERNAL CAVITY LASERS WITH FREQUENCY OFFSET TUNING

(75) Inventor: Vladimir Kupershmidt, San Francisco, CA (US)

(73) Assignee: Redfern Integrated Optics, Inc., Santa Clara, CA (US)

( * ) Notice: Subject to any disclaimer, the term of this patent is extended or adjusted under 35 U.S.C. 154(b) by 0 days.

(21) Appl. No.: 12/788,235

(22) Filed: May 26, 2010

(65) Prior Publication Data
US 2010/0303111 A1    Dec. 2, 2010

Related U.S. Application Data

(60) Provisional application No. 61/181,192, filed on May 26, 2009.

(51) Int. Cl.
*H01S 3/13* (2006.01)
(52) U.S. Cl. ............................ 372/32; 359/326; 398/183
(58) Field of Classification Search ...................... 372/32
See application file for complete search history.

(56) References Cited

U.S. PATENT DOCUMENTS

| 5,383,210 A | 1/1995 | Ichikawa |
| 5,780,844 A | 7/1998 | Egalon et al. |
| 7,499,151 B2 | 3/2009 | Bao et al. |
| 2003/0118349 A1 | 6/2003 | Ohara et al. |
| 2003/0197917 A1* | 10/2003 | Yap et al. ...................... 359/330 |
| 2005/0018724 A1 | 1/2005 | Da Silva et al. |
| 2006/0239312 A1 | 10/2006 | Kewitsch et al. |
| 2008/0018903 A1 | 1/2008 | Bao et al. |
| 2008/0272850 A1 | 11/2008 | Takasaka et al. |
| 2009/0245306 A1 | 10/2009 | Rakuljic |
| 2010/0080564 A1 | 4/2010 | Fujii |
| 2010/0085992 A1 | 4/2010 | Rakuljic et al. |

FOREIGN PATENT DOCUMENTS
WO    WO2007/124063 A2    11/2007

OTHER PUBLICATIONS

U.S. Appl. No. 12/787,646, filed May 26, 2010, Alalusi et al.

(Continued)

*Primary Examiner* — Jessica T Stultz
*Assistant Examiner* — Xinning Niu
(74) *Attorney, Agent, or Firm* — David H. Jaffer; Pillsbury Winthrop Shaw Pittman LLP (57) ABSTRACT

An optical phase lock loop (OPLL) system is disclosed that includes a master external cavity laser (ECL), and a substantially identical slave ECL. The master and slave ECLs are fabricated using a planar semiconductor device with waveguide-integrated planar Bragg gratings (PBG). Both the master and slave ECLs have a narrow linewidth and a low frequency-noise. Each of the ECLs has their own controller-modulator circuits for thermal tuning or electrical tuning via direct modulation. A laser-select-logic (LSL) module receives and processes a filtered phase error signal from a loop filter coupled to an electronic PLL device, and directs the processed phase error signal to one or both of the master and slave controller-modulators according to a logical determination of a required mode of operation of the OPLL system in order to achieve a stable and identical phase performance of the master and the slave ECLs. The required mode of operation is chosen from a locking mode, a prediction mode, a tracking mode, and a searching mode.

17 Claims, 5 Drawing Sheets

OTHER PUBLICATIONS

Satyan, N. et al.; "Phase-Controlled Apertures Using Heterodyne Optical Phase-Locked Loops," Jun. 1, 2008, IEEE Photonics Technology Letters, vol. 20, No. 11, pp. 897-899.

Yariv, A. et al.; "Opitcal Phase-Lock Loops for Terahertz Photonics," California Institute of Technology, Lee Center Workshop, May 23, 2008, 29 pages.

Liang, W. et al.; "Coherent Beam Combining with Multilevel Optical Phase-Locked Loops," Dec. 2007, J. Opt. Soc. Am. B, vol. 24, No. 12, pp. 2930-2939.

Liang, W. et al.; Coherent Power Combination of Two Master-Oscillator-Power-Amplifier (MOPA) Semiconductor Lasers Using Optical Phase Lock Loops, Mar. 19, 2007, Optics Express, vol. 15, No. 6.

* cited by examiner

PAIR OF OPTICALLY LOCKED SEMICONDUCTOR NARROW LINEWIDTH EXTERNAL CAVITY LASERS WITH FREQUENCY OFFSET TUNING

CROSS REFERENCE TO RELATED APPLICATION

This application claims priority from U.S. Provisional Application Ser. No. 61/181,192 filed May 26, 2009.

FIELD OF THE INVENTION

The present invention relates to implementing a high-performance, high-stability, small footprint Optical Phase Locked Loop system using a pair of semiconductor external cavity lasers.

BACKGROUND

Phase Lock Loop (PLL) is a common electronic feedback system used in various electronic systems (e.g., radars, communications, TV, computers, cell phones, etc.) Some of the key parts of a PLL system include a phase detector (PD), a local oscillator (LO), a loop filter, etc. The LO frequency can be tuned by changing the input voltage or current. In a PLL circuit, the LO is forced to follow frequency/phase of an incoming/reference signal. The LO is locked onto the incoming signal such that LO and incoming/reference signal have 'identical' frequency/phase performance in the bandwidth of interest.

Optical Phase Lock Loop (OPLL) is the counterpart of an electronic PLL in the optical domain. In an OPLL circuit, two lasers are used. They may be referred as a 'master' and 'slave.' One laser (typically, the slave laser) plays the role of LO and is locked to another reference signal coming from the other laser (typically, the master laser.) As a result, both the lasers in an OPLL system have identical frequency/phase characteristics in the bandwidth of interest.

The two lasers used in the OPLL circuit may be diode-pumped Nd:YAG lasers or fiber lasers. Such lasers have slow speed of frequency tuning (typically, tens of millisecond range) limited by the speed of piezo-electric transducer (PZT) used to change the cavity length of the lasers. Another disadvantage of lasers is that they are usually highly sensitive to environmental changes, and require frequent calibration and maintenance to achieve desired performance.

An alternative to the Nd:YAG laser and the fiber laser are semiconductor-based devices, such as Distributed Feedback Laser (DFB) and External Cavity Lasers (ECL). Semiconductor-based OPLL devices offer the advantage of smaller size and lower power consumption, and often offer competitive or lower cost of manufacturing. OPLL based on DFB lasers require very large bandwidth (BW) of operation because of the large linewidth of DFB lasers (more than a few hundred kHz). Such large BW of operation consequently includes so-called phase reversal frequency (1-10 MHz), where phase of laser frequency modulation (FM) response changes its sign. Presence of the phase reversal frequency within the BW of OPLL leads to instability in operation and requires complicated electronics for correcting such effects. Another adverse problem with DFB based OPLL is their very high sensitivity of FM response caused by current and temperature response to the environmental changes, which forces the OPLL to "ramp" outside of the voltage locking range, and correspondingly lose their lock. Semiconductor-based ECL technology provides very narrow linewidth (in the range of 10 kHz or less), low frequency noise, and FM bandwidth up to 1 MHz, all of which are essential for stable OPLL implementation. ECLs with very narrow linewidth do not require very large BW and correspondingly allow to avoid operation with phase reversal frequency within the OPLL bandwidth. Inherent wavelength stability of ECL to the environmental changes makes them an excellent candidate for OPLL implementation with ability of long-term locking operation.

Accordingly, what is needed is an implementation of OPLL system using semiconductor-based ECLs and associated electronic components, packaged in a relatively smaller-footprint package that offers reliable and easily controllable performance at low power consumption and manufacturing cost.

SUMMARY OF THE INVENTION

The present invention describes a high-performance OPLL system having a pair of narrow-linewidth and low-frequency-noise semiconductor-based ECLs, associated polarization-maintaining (PM) optical components, and associated opto-electronic sub-system modified to accommodate the characteristics of the ECLs. The system offers long-term stable operation, and is housed within a small form-factor package.

According to certain aspects of the present invention, an OPLL system is disclosed, comprising: a first (master) ECL and a second (slave) ECL, both having a narrow linewidth and low frequency-noise; a first controller-modulator that controls a master ECL; a second controller-modulator that controls a slave ECL, both controller-modulators being precision modules with low frequency-noise temperature and current control circuitry; a microwave heterodyne receiver that receives coherent heterodyne optical beat signal from the master and the slave ECLs, and outputs an amplified microwave beat frequency signal therefrom; a direct digital synthesizer (DDS) that supplies a control frequency to an electronic phase lock loop (PLL) circuit that receives the beat frequency, and generates a phase error signal; and a loop filter that provides gain in the bandwidth of frequency response of the controller-modulators, and feeds the error signal and a correction signal to the first and the second controller-modulators via a laser select logic (LSL) module, to achieve a stable and identical phase performance of both ECLs.

According to another aspect of the invention, an OPLL system is disclosed, comprising: a master ECL, having a narrow linewidth and low frequency noise, a first controller-modulator that controls the master ECL, a slave ECL, substantially similar (in all characteristics) to the master ECL, a second controller-modulator that controls the slave ECL, a optical microwave receiver that receives an optical beat frequency via a polarization maintaining (PM) fiber, and outputs an amplified a beat frequency signal therefrom; a DDS module that supplies an intermediate control frequency (IF); a pre-scalar module that scales down the receiver microwave beat frequency; an electronic PLL circuit that receives the scaled down beat frequency and the IF control frequency, and generates a phase error signal therefrom; and a loop filter that provides gain in the BW of frequency response of the controller-modulators, and feeds and distributes the error signal and a correction signal to the first and the second controller-modulators via a LSL module. to achieve a stable and identical phase performance of both the master and slave ECLs.

According to yet another aspect of the invention, the OPLL system is configured to operate in at least four different modes of operations, namely, a standard locking mode, a prediction mode, a tracking mode, and a searching mode. Some of the modes may run in the background as a performance monitoring or performance maintaining mode irrespective of a newly requested/determined frequency tuning requirement.

Example types of applications of the above OPLL systems include, but are not limited to, distributed fiber optic Brillouin based sensing (Brillouin Optical Time Domain Analysis, abbreviated as BOTDA, and Brillouin Optical Time Domain Reflectometry, abbreviated as BOTDR), Coherent Rayleigh (CR) based sensing, airborne coherent Doppler LIDAR, microwave photonics, heterodyne metrology, etc. Persons skilled in the art will appreciate, in view of the present specification and claims, that these embodiments of the present invention can be modified according to the specific types and fields of application.

The invention itself, together with further objects and advantages, can be better understood by reference to the following detailed description and the accompanying drawings.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EXAMPLE EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein.

Moreover, applicants do not intend for any term in the specification or claims to be ascribed an uncommon or special meaning unless explicitly set forth as such. Further, the present invention encompasses present and future known equivalents to the known components referred to herein by way of illustration.

The present invention describes an OPLL system with tunable frequency offset based on two narrow linewidth ECLs (master and slave). In traditional OPLLs, a master laser exhibits superior frequency stability and a narrow linewidth, and the slave laser is a noisier and less stable, and tries to lock onto the master laser by following the master laser's phase noise characteristics. In the present invention, instead of using one superior-performance laser, and one inferior performance laser, two substantially identical ECLs are used in an OPLL system with two output optical ports. This is a novel feature of the present invention. Still, the terminologies 'master' and 'slave' will be used to keep legacy of OPLL, terminology for the reader's convenience. The two ECLs are selected such that they have a fixed frequency separation (offset) by design. The frequency offset is maintained, i.e. locked and tuned (as required by the specific applications) by the OPLL. A pair of optically locked narrow-linewidth ECLs is an essential component for high-resolution distributed coherent sensing for infrastructure health monitoring and other applications, examples of which are discussed in the summary section above.

Semiconductor ECLs used in the OPLL implementation based on Planar Lightwave Circuit (PLC) technology with integrated waveguide Bragg grating design exhibit very low frequency noise, low Relative Intensity Noise (RIN) and linewidths less than 10 kHz. PLC-based ECLs may also exhibit polarization selectivity. Other optical components used in the OPLL system are chosen to be polarization maintaining (PM) as well.

In general, a bandwidth of an OPLL system should be at least twice as big as the linewidth of individual lasers in order to achieve stable performance. By using very narrow linewidth ECLs in the present invention, bandwidth requirements for OPLL system can be reduced below 300-500 kHz which is considerably less then frequency of phase reversal where OPLL operation is unstable.

Offset frequency tuning is achieved by using FM properties of ECLs, i.e. when a fast voltage control signal is applied to a controller-modulator that controls and/or modulates the ECLs, the controller-modulator generates a corresponding modulation bias current which changes the offset frequency. To avoid large tuning amplitude, and correspondingly power variations OPLL, the present invention uses a concept of synchronous tuning when tuning amplitude is split between two ECLs, i.e. each of them is tuned at the same time in opposite directions. Using such approach, fast tuning is achieved on a time scale of a fraction of millisecond (for example, 100 μsec). However, persons skilled in the art will understand that synchronous tuning is just one example of offset tuning, and is not limiting the scope of the invention. Synchronous tuning is further elaborated with respect to FIG. 3 in a later part of the specification.

Figure 1:
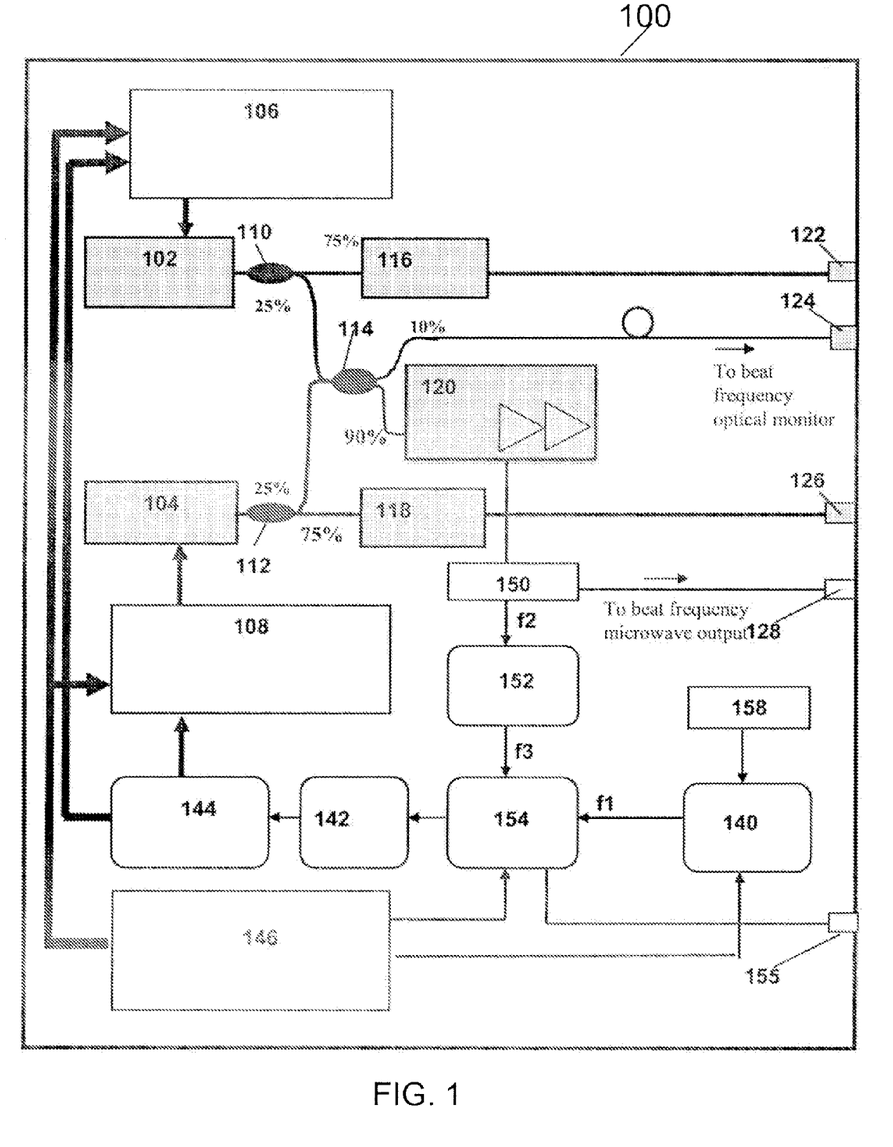
FIG. 1 illustrates a block diagram of the OPLL system, according to an embodiment of the present invention.
Figure 2:
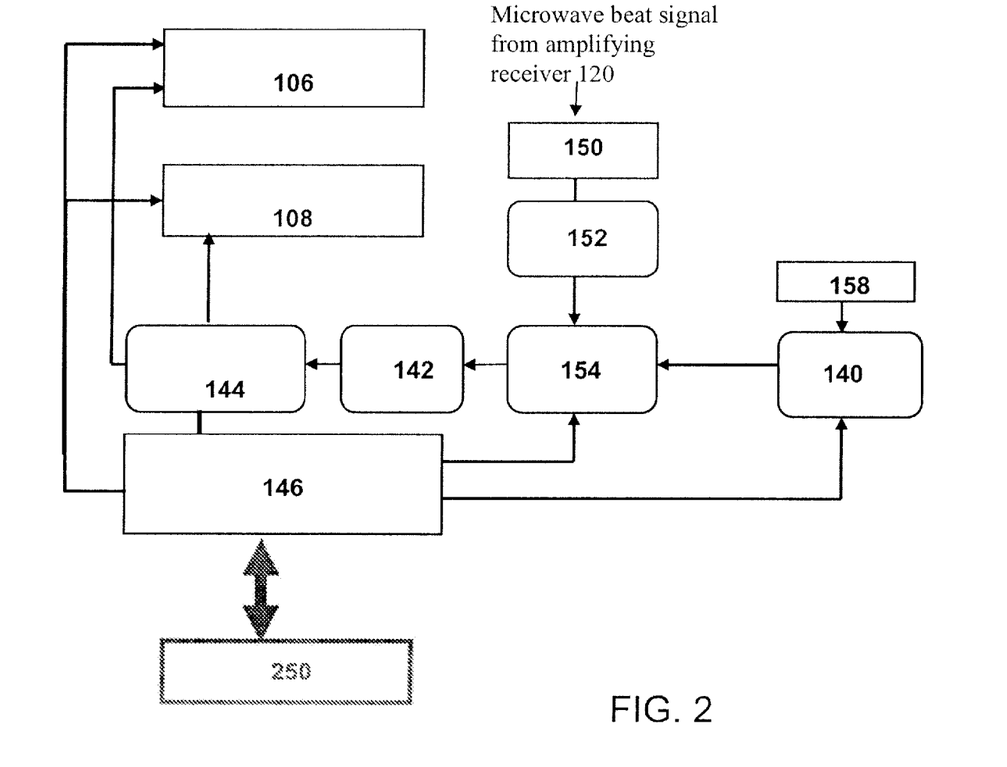
FIG. 2 illustrates electronic components of an OPLL system, according to an embodiment of the present invention.

FIG. 1 shows a schematic block diagram of an OPLL embodiment, according to the present invention. FIG. 2 shows just the electronic components of the OPLL system shown in FIG. 1, where a microprocessor 146 talks to an external host computer 250, not included in the OPLL package 100 shown in FIG. 1. Most of the components of the OPLL system are housed within a small form-factor package 100. Individual ECLs 102 and 104 may be packaged in the standard 14-pin butterfly telecom packages, or other types of packages. ECL 102 may have, as an example, a wavelength of 1549.374 nm, and ECL 104 may have, as an example, a wavelength of 1549.286 nm, ensuring an initial frequency offset in the GHz range, that may be tuned as required. ECL 102 is coupled to a controller-modulator 106, and ECL 104 is coupled to a controller-modulator 108. Commercial examples of packaged ECLs are PLANEX™ modules manufactured by Redfern Integrated Optics (RIO) Inc. of Santa Clara, Calif. Commercial examples of packaged controller-modulator modules are ORION™ modules manufactured by Redfern Integrated Optics Inc. Controller-modulator modules are self-contained low-frequency-noise precision modules that maintain the high performance of the ECLs. Controller-modulator modules 106 and 108 include the required bias current and temperature control circuitry for thermal tuning (slow tuning) and FM fast tuning.

A polarization maintaining (PM) optical coupler 110 directs a fraction (e.g., 25%) of the output of ECL 102 towards receiver 120. The remaining fraction (e.g., 75%) of the output is transmitted through inline power monitor 116 to corresponding first optical port 122. Output of ECL 104 is transmitted via PM optical coupler 112 and inline power monitor 118 to second optical port 126. Fractional balanced outputs from the two ECLs are combined at another 2×2 polarization maintaining coupler 114 prior to entering the receiver 120. Receiver 120 is a heterodyne receiver in the microwave range. Persons skilled in to art will understand that the microwave frequency range may also include RF frequencies, and other ranges of frequencies can be handled by the present invention too. Coupler 114 splits the total signal received into two branches, the majority (e.g., 90%) going towards the receiver 120, and the rest (e.g 10%) going towards a beat frequency optical monitor (not specifically shown in FIG. 1) through corresponding optical port 124. Receiver 120 includes a low-noise high-gain linear microwave amplifier (LNA). Receiver 120 has a bandwidth that accommodates the required frequency offset (e.g., 8-14 GHz) range, and the balanced power detection scheme ensures a low-noise operation.

Amplified output from the receiver 120 (beat frequency $f_2$ in the microwave range) goes to a directional coupler 150, and optionally, from there, to a beat frequency microwave output monitor (not specifically shown in FIG. 3) through corresponding microwave port 128.

Though ideally the OPLL can operate in the higher frequency regime, for practical reasons, it makes sense to scale down the higher frequency to a range of frequency for which standard electronic communication sub-systems can be used, driving down the cost of the entire OPLL system. For example, a divide-by-4 pre-scalar 152 may convert frequency $f_2$ into frequency $f_3$ where $f_3=f_2/4$. In an example, $f_3$ is in the 2-3 GHz range.

A reference local oscillator (LO) 158 (typically with a frequency of oscillation in the 60 MHz range) is coupled to a Direct Digital Synthesizer (DDS) 140. DDS 140 generates a control frequency $f_1$, which is, for example, in the 1-2 MHz range.

Figure 5A:
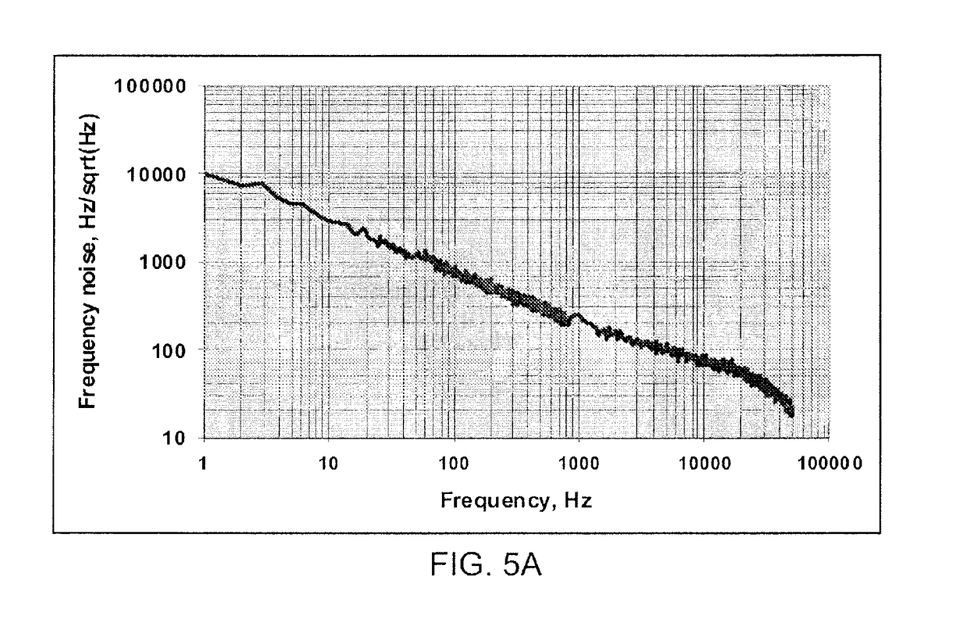
FIGS. 5A-B show example characteristics of a loop filter designed to work within the OPLL system of the present invention
Figure 5B:
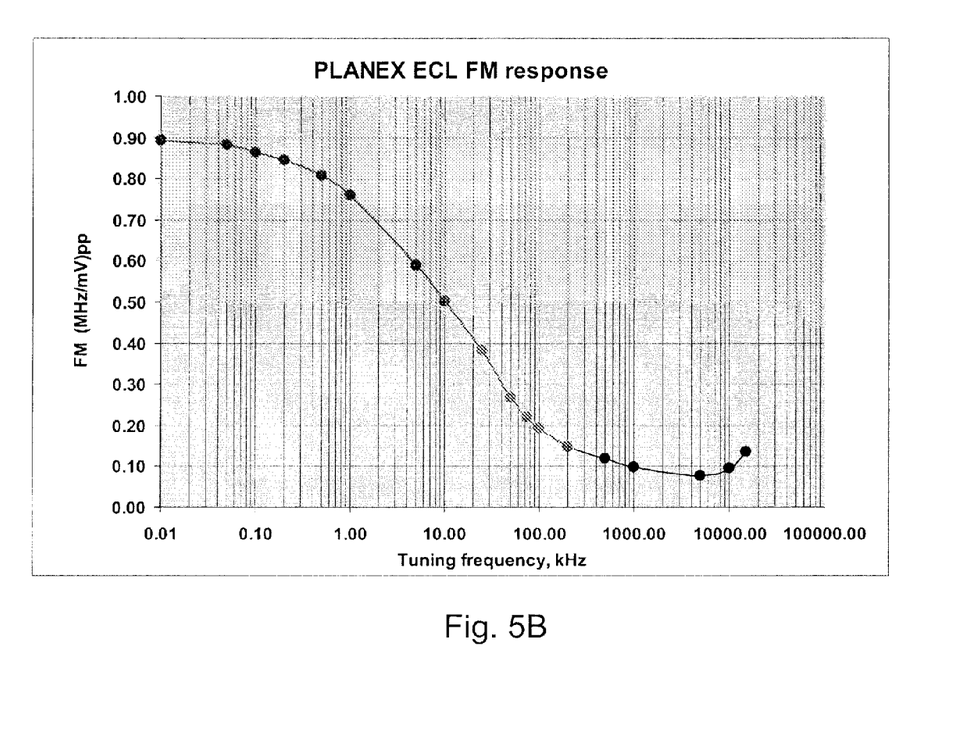

The scaled down beat frequency and the control frequency are received by electronic PLL circuit 154. PLL circuit 154 is shown as a separate functional block, but may include the pres-scalar 152 and DDS 140 and LO 158 as a combined module. PLL circuit 154 generates phase frequency dependent error signal. Small power fraction (~1-5%) of the error signal may be fed to an error signal monitor (not specifically shown in FIG. 1) through port 155. The main fraction of the error signal is fed to a loop filter 142 that provides frequency dependent gain within the BW of controller-modulators 106 and 108. Design of the loop filter 142 is customized to accommodate particular characteristics of the frequency noise and FM response of ECLs used in the OPLL system, as shown in FIGS. 5A and 5B.

Laser-select-logic module 144 and microprocessor 146 control modes of operations of the OPLL. There are four major OPLL modes of operation required to maintain PLL voltage locking over requested offset tuning range and long term environmental change range. The modes are described below:

1. Locking mode: When a frequency offset is fixed, ambient temperature is fixed, and there is no new request for frequency tuning, then the OPLL operates in main/standard locking mode, i.e. the slave ECL is phase locked onto the master ECL. In locking mode, error signal is directed by laser select logic (LSL) module 144 to the slave laser controller-modulator 108.

2. Prediction mode: When new offset frequency is acquired, two things happen: DDS 140's frequency is changed, causing the PLL 154 to change drive currents on each controller-modulator modules 108 and 106. In response, temperature is changed (slow loop) such that, after the new frequency is acquired, the control voltage generated by modules 108 and 106 force the PLL to remain within the center of locking range. In this mode, LSL module 144 distribute temperature corrected signals to both the master and slave ECLs, and simultaneously, "fast signal" from a loop filter 142 supplies an error signal to the slave ECL. Note that any one of the ECLs 102 and 104 may act as a master, and the other acts as a slave. As an example, it is assumed that ECL 102 is the master, and ECL 104 is the slave.

3. Tracking mode: Because the frequency of the ECLs changes with the ambient temperature, it is necessary make a correction to account for long term drifts. Again, such correction is done by periodically (e.g., by every 100 msec) sampling the control voltage. Correspondingly, LSL 144 sends signals to change temperatures of both master and slave ECLs to keep the PLL 154 voltage in the centre of locking range.

4. Searching mode: When the incoming frequency is outside the PLL locking range (during start up or large frequency steps), the PLL voltage tends to 'rail' either to the high side or the low side The microprocessor 146 changes a temperature of master and slave ECLs to bring PLL 154 voltage back to the locking range.

Prediction, tracking and searching modes of operation are so-called "slow modes" with temperature correction signals supplied to both ECLs: master 102 via controller-modulator 106 and slave 104 via controller-modulator 108. At the same time fast error correction signal is always applied to the slave ECL 104 via the modulator part of the controller-modulator 108. During operation, microprocessor 146 receives requests for new offset frequency, or generates PLL status periodically (i.e., at 100 msec) via an interface to an external host computer 250, as shown in FIG. 2. Persons skilled in the art will understand that these modes and their nomenclature are for illustrative purpose only, and not meant to be restrictive. Other modes of operation is possible. One or more of the modes may be always on as background process for performance monitoring of the OPLL system, such as the tracking mode for correcting thermal drift, and/or the searching mode. Other modes, such as the locking mode and/or the prediction mode may be initiated based on a determination by the LSL module. Also, one or more modes may run simultaneously or serially in order to achieve the ultimate goal of stable phase locking.

Figure 3:
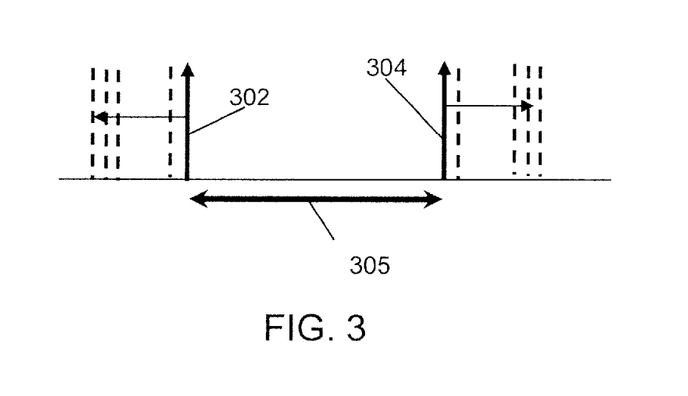
FIG. 3 illustrates the concept of synchronous frequency offset tuning of ECLs, used in one embodiment of the present invention.

FIG. 3 shows the basic concept of offset frequency tuning, specifically synchronous frequency tuning. 302 and 304 indicates initial frequencies of the two ECLs, offset by the amount indicated by 305. In synchronous tuning, the frequency 302 is decreased by a certain amount, and the frequency 304 is increased by the same amount, i.e. frequencies are changed in the opposite directions. Example of fixed frequency offset may be 8-14 GHz in certain applications. A frequency tuning range (the range within which the initial frequency is increased or decreased) may be 1 GHz. Frequency may be increased or decreased continually, or in steps, for example, in step resolution of 50 kHz to 10 MHz. Tuning speed may be in the range of 100 to 150 microseconds. Also, it is easily understood that depending on the tuning range, concept of synchronous frequency tuning is just one of the possibilities. One of the frequencies may be fixed, and the other frequency may be tuned to tune the offset. Two frequencies may be tuned in the same direction or in the opposite directions, and may be individually adjusted up or down.

Figure 4A:
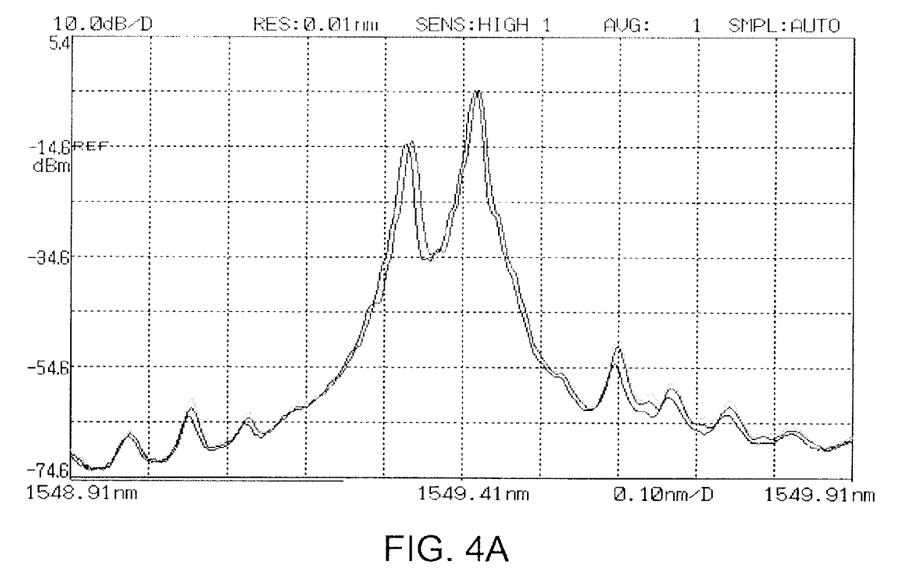
FIGS. 4A-B show optical and microwave beat frequency spectrums under locking conditions, according to one embodiment of the present invention.
Figure 4B:
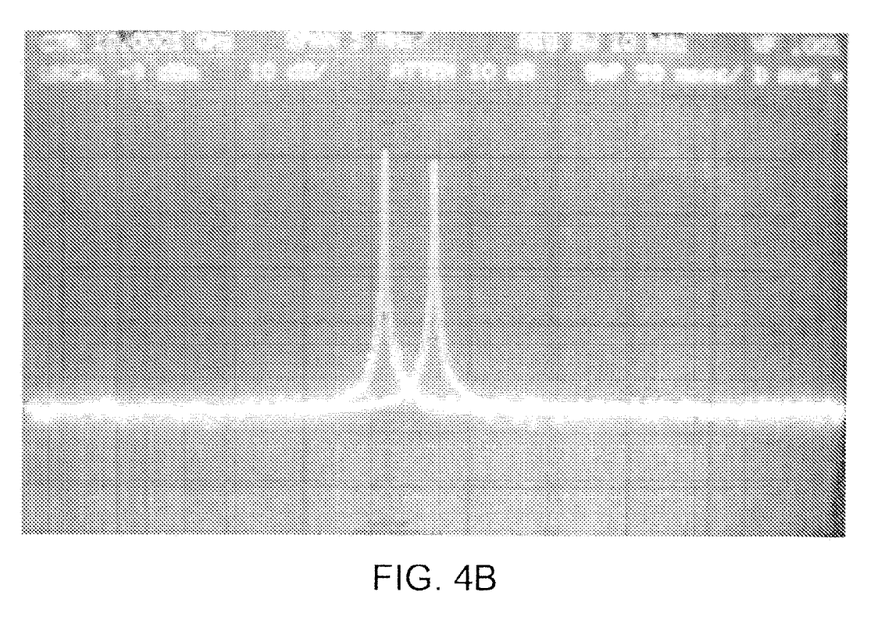

FIG. 4A shows an example optical beat frequency signal (10 GHz offset) that can be seen in an optical spectrum analyzer coupled to the optical port 122 shown in FIG. 1. FIG. 4B shows an example of a microwave beat spectrum at different offset frequencies (i.e. in the locking condition) that can be seen in a frequency analyzer coupled to the microwave port 128 shown in FIG. 1.

FIGS. 5A and 5B show loop filter 142 design considerations. FIG. 5A shows frequency noise response and FIG. 5B shows frequency modulation response of one of the ECLs (for example, a PLANEX ECL 102) in a tuning frequency range of interest. Using narrow linewidth low noise ECLs simplifies loop filter design, but the loop filter bandwidth should comfortably accommodate the ECL linewidth and frequency tuning range.

Figure 6:
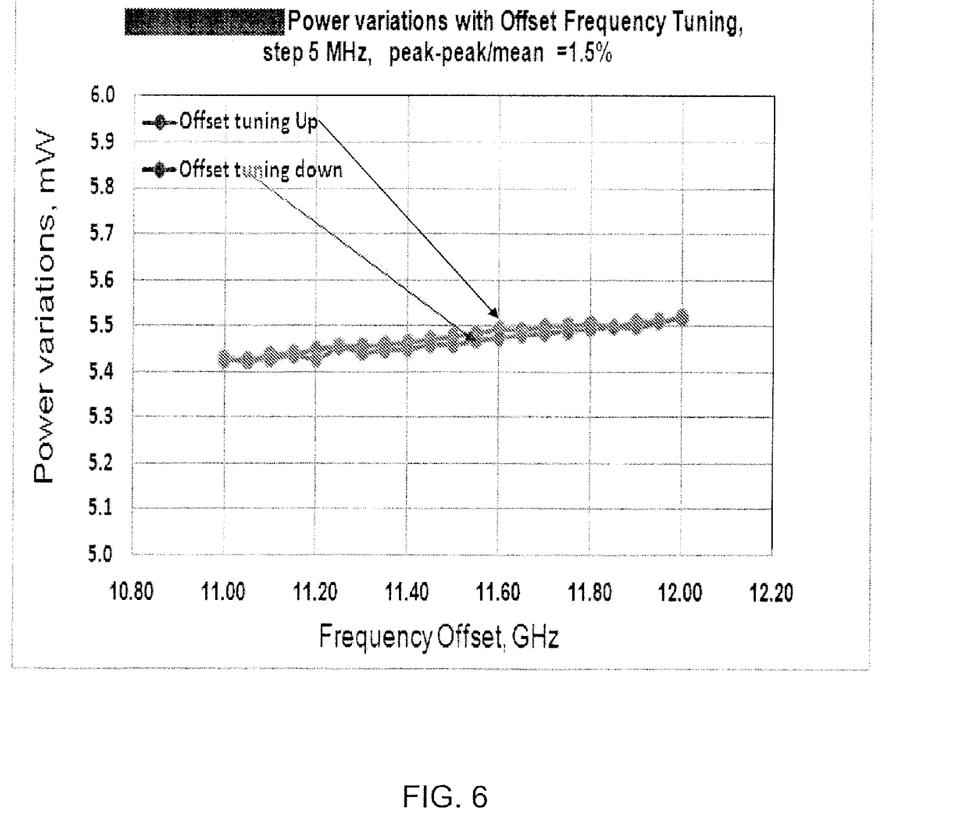
FIG. 6 shows variation of power during frequency tuning, according to an example embodiment of the present invention.

FIG. 6 shows an example ECL (e.g., a PLANEX ECL 102) power variation associated with synchronous frequency tuning in an example range of interest of the offset frequency. The peak power variation for each ECL is within a reasonable range, indicating stable operation over the frequency tuning range. It is noted that the power variations during offset tuning up and offset tuning down are almost identical, as shown in FIG. 6 by the superimposed curves.

Example Application: Distributed Fiber Optic Sensing

There are growing requirements in civil engineering for high resolution distributed fiber optic sensing and monitoring of critical infrastructure installations. Distributed sensing is particularly important for detecting early signs of damage along the whole infrastructure. Such damages result in abnormal changes in temperature and stress in some locations along the infrastructure. Brillouin and coherent Rayleigh based systems are capable of providing temperature and stress information distributed along a passive sensing fiber embedded in the infrastructure. To satisfy such requirements as high resolution temperature (<0.1° C.) and strain (<few µε) measurements and fast data acquisition (fast update rate), it is necessary to have an OPLL which can control and maintain frequency offset between two lasers with an accuracy better than 50 kHz, and at the same time, can have fast frequency tuning capability of the order of 100 µsec. Accounting on the fact that such requirements must be maintained over environmental operating temperature of 0 to 75° C., it is practically impossible to achieve this with OPLL design based on lasers other then semiconductor ECL lasers. Persons skilled in the art will understand that this application is just one of the possible applications of an OPLL as described in the present invention. Other types and fields of applications are possible with suitable modifications, without departing from the scope and essence of the present invention.

What is claimed is:

1. An optical phase lock loop (OPLL) system, comprising:
   a master external cavity laser (ECL) comprising a planar semiconductor device with waveguide-integrated planar Bragg gratings (PBG), and having a narrow linewidth and a low frequency-noise;
   a slave ECL, substantially similar to the master ECL, with an adjustable frequency offset with respect to the master ECL;
   a master controller-modulator configured to control a temperature and current modulation of the master ECL, having a frequency response that accommodates characteristics of the master ECL;
   a slave controller-modulator, substantially similar to the master controller-modulator, configured to control a temperature and current modulation of the slave ECL, having a frequency response that accommodates characteristics of the slave ECL;
   a heterodyne receiver that receives a coherent heterodyne optical beat signal from the master and the slave ECLs via optical components, and outputs an amplified electronic beat frequency signal in a microwave frequency range;
   a direct digital synthesizer (DDS) module that supplies a control frequency;
   an electronic phase lock loop (PLL) module that receives the amplified electronic beat frequency signal from the heterodyne receiver, and also receives the control frequency from the DDS, and generates an error signal;
   a loop filter that receives the error signal, and provides gain in a bandwidth of the frequency response range of the master and slave controller-modulators; and
   a laser-select-logic (LSL) module that receives and processes a filtered error signal from the loop filter, and directs the processed error signal to one or both of the master and slave controller-modulators according to a logical determination of one or more required modes of operation of the OPLL system in order to achieve a stable and identical phase performance of the master and the slave ECLs.

2. The OPLL system of claim 1, wherein the required modes of operation are chosen from a locking mode, a prediction mode, a tracking mode, and a searching mode.

3. The OPLL system of claim 2, wherein in the locking mode, a frequency offset between the master and the slave ECLs is fixed and an ambient temperature is fixed, and there is no new request for frequency offset tuning.

4. The OPLL system of claim 3, wherein the LSL module directs the processed error signal to the slave controller-modulator only.

5. The OPLL system of claim 2, wherein in the prediction mode, there is a new request for tuning a frequency offset between the master and the slave ECLs.

6. The OPLL system of claim 5, wherein the LSL module processes the error signal to generate a temperature correction signal that is directed to both the master and the slave controller-modulators to achieve relatively slower thermal tuning.

7. The OPLL system of claim 5, wherein the LSL module directs the processed error signal to the slave controller-modulator only to achieve relatively faster electrical tuning via direct modulation.

8. The OPLL system of claim 2, wherein in the tracking mode, long term thermal drift is corrected periodically.

9. The OPLL system of claim 8, wherein a correction period is in the order of 100 milliseconds.

10. The OPLL system of claim 8, wherein the LSL module generates a temperature correction signal that is directed to both the master and the slave controller-modulators to bring temperatures of both the master and the slave ECLS to a desired ambient temperature.

11. The OPLL system of claim 2, wherein in the searching mode, the amplified electronic beat frequency signal is outside of a locking range of the electronic PLL module, and an indicative error signal is generated by the PLL module.

12. The OPLL system of claim 11, wherein the indicative error signal is directed to a microprocessor, and the microprocessor generates a temperature correction signal that is directed to both the master and the slave controller-modulators to change temperatures of both the master and slave ECLs, such that a subsequent beat frequency signal is within the locking range of the electronic PLL module.

13. The OPLL system of claim 1, wherein each of the master and slave ECLs has a linewidth of less that 10 kHz.

14. The OPLL system of claim 1, wherein the electronic PLL module comprises a prescalar that scales down the amplified electronic beat frequency signal to an intermediate frequency range.

15. The OPLL system of claim 1, wherein one required mode of operation may be always on, and another mode of operation is adopted according to a logical determination by the LSL module.

16. The OPLL system of claim 1, wherein the error signal may be a phase error signal used for frequency offset tuning.

17. The OPLL system of claim 1, wherein optical components used in the system maintain a constant polarization of optical signal.

* * * * *